(12) United States Patent
Jansen et al.

(10) Patent No.: US 11,789,373 B2
(45) Date of Patent: Oct. 17, 2023

(54) OBJECT POSITIONING SYSTEM DIAGNOSTIC AND CALIBRATION METHODS POSITIONING CONTROL METHOD LITHOGRAPHIC APPARATUS AND DEVICE MANUFACTURING METHOD

(71) Applicant: ASML Netherlands B.V., Veldhoven (NL)

(72) Inventors: Bas Jansen, Den Bosch (NL); Samer Abdelmoeti Abuzeid Abdelmoeti, Eindhoven (NL); Hans Butler, Best (NL); Koen Johan Frederik Loonen, 's-Hertogenbosch (NL); Aditya Singh, Eindhoven (NL); Ruben Etienne Johan Rinus Vandervelden, Oostham (BE)

(73) Assignee: ASML Netherlands B.V., Veldhoven (NL)

( * ) Notice: Subject to any disclaimer, the term of this patent is extended or adjusted under 35 U.S.C. 154(b) by 47 days.

(21) Appl. No.: 17/602,616

(22) PCT Filed: Mar. 10, 2020

(86) PCT No.: PCT/EP2020/056389
§ 371 (c)(1),
(2) Date: Oct. 8, 2021

(87) PCT Pub. No.: WO2020/207684
PCT Pub. Date: Oct. 15, 2020

(65) Prior Publication Data
US 2022/0197157 A1   Jun. 23, 2022

(30) Foreign Application Priority Data

Apr. 10, 2019 (EP) .................................... 19168367
Aug. 8, 2019 (EP) .................................... 19190665

(51) Int. Cl.
*G03F 7/00* (2006.01)
*G03F 7/20* (2006.01)

(52) U.S. Cl.
CPC ................................ *G03F 7/70775* (2013.01)

(58) Field of Classification Search
CPC ................................................... G03F 7/70775
See application file for complete search history.

(56) References Cited

U.S. PATENT DOCUMENTS 7,161,281 B2 * 1/2007 Takeuchi ............. H10N 30/097
310/322
9,812,631 B2 * 11/2017 Ebigase ............. H10N 30/2047
(Continued)

FOREIGN PATENT DOCUMENTS

JP   2013029457 A   2/2013
WO  WO2018/158206 A1   9/2018

OTHER PUBLICATIONS

International Search Report and Written Opinion directed to related International Patent Application No. PCT/EP2020/056389, dated Jun. 17, 2020; 13 pages.
(Continued)

*Primary Examiner* — Hung V Nguyen
(74) *Attorney, Agent, or Firm* — Sterne, Kessler, Goldstein & Fox P.L.L.C.

(57) ABSTRACT

The invention relates to an object positioning system including an actuator system and a measurement system. The actuator system includes an actuator made of a material with predominantly electrostrictive properties and substantially no net polarization in absence of an electric field. The actuator system is configured to apply an electric field to the actuator, which electric field includes a bias electric field and an actuation electric field superimposed on the bias electric field, a field strength of the actuation electric field being equal to or smaller than a field strength of the bias electric
(Continued)

field. The measurement system is configured to measure an electrical property of the actuator which is representative for a mechanical state of the actuator. The measurement system includes a bridge circuit including an actuator and a reference element having electrical properties matched to the electrical properties of the actuator.

20 Claims, 4 Drawing Sheets

(56) References Cited

U.S. PATENT DOCUMENTS

| | | |
|---|---|---|
| 2002/0084717 A1 | 7/2002 | Murphy |
| 2004/0046484 A1* | 3/2004 | Schiller ............... H10N 30/802 310/317 |
| 2005/0275822 A1 | 12/2005 | Butler |
| 2006/0264015 A1 | 11/2006 | Hyde et al. |
| 2015/0185469 A1 | 7/2015 | Horn et al. |
| 2015/0280390 A1 | 10/2015 | Griffin et al. |
| 2016/0209752 A1 | 7/2016 | Steinbach et al. |
| 2019/0050102 A1 | 2/2019 | Johnson et al. |

OTHER PUBLICATIONS

International Preliminary Report on Patentability directed to related International Patent Application No. PCT/EP2020/056389, dated Sep. 28, 2021; 10 pages.

Ivira, B., et al., "Integration of Electrostrictive $Ba_{0.7}Sr_{0.3}TiO_3$ thin films into bulk acoustic wave resonator for RF-frequency tuning under DC bias," *2008 IEEE International Frequency Control Symposium*, May 19, 2008; pp. 254-258.

Morgan, R., et al., "Actuator Fault Detection via Electrical Impedance Testing," *Proc. Cf SPIE*, vol. 6711 (2007); pp. 67110A-1-67110A-11.

Juncheng, Y., et al., "Current status of development of low temperature deformable mirrors," *Proc. cfSPIE*, vol. 10697 (2018); pp. 1069744-1-1069744-12.

* cited by examiner

OBJECT POSITIONING SYSTEM DIAGNOSTIC AND CALIBRATION METHODS POSITIONING CONTROL METHOD LITHOGRAPHIC APPARATUS AND DEVICE MANUFACTURING METHOD

CROSS-REFERENCE TO RELATED APPLICATION

This application claims priority of EP application 19168367.1 which was filed on Apr. 10, 2019 and EP application 19190665.0 which was filed on Aug. 8, 2019 and which are incorporated herein in its entirety by reference.

BACKGROUND

The present invention relates to an object positioning system, an object including such an object positioning system, and a lithographic apparatus including such an object positioning system. The present invention further relates to a corresponding positioning control method, diagnostic and calibration methods, and a device manufacturing method.

FIELD OF THE INVENTION

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, objects or parts thereof, e.g. surfaces such as mirror surfaces or support surfaces thereof, need to be positioned accurately in order to achieve the required system performances. However, for some applications, due to the limited available size and/or the complexity of the system, no separate sensors can be implemented or implementing separate sensors is not desired as the disadvantages do not outweigh the advantages.

In such cases, no feedback control is possible and control is done feedforward based on calibration data. However, making a system diagnostics and doing a recalibration without sensors during the lifetime of the apparatus is then cumbersome and early detection of a failure or further analyses of the cause of a failure or problem will be time consuming. Further, the achievable accuracy is poor as resonances may be excited and the vibrations may be present longer than desired.

SUMMARY

It is desirable to provide an object positioning system that can be better controlled and/or analyzed without introducing separate sensors.

According to an embodiment of the invention, there is provided an object positioning system including:
an actuator system; and
a measurement system,
wherein the actuator system comprises an actuator made of a material with predominantly electrostrictive properties and substantially no net polarization in absence of an electric field,
wherein the actuator system is configured to apply an electric field to the actuator, which electric field comprises a bias electric field and an actuation electric field superimposed on the bias electric field, a field strength of said actuation electric field being equal to or smaller than a field strength of the bias electric field,
wherein the measurement system is configured to measure an electrical property of the actuator which is representative for a mechanical state of the actuator, and
wherein the measurement system comprises a bridge circuit including an actuator and a reference element having electrical properties matched to the electrical properties of the actuator, wherein the actuation system is configured to apply the same electric field to the actuator and the reference element, and wherein the bridge circuit is configured to output a signal representative for a difference in behavior of the actuator and the reference element.

According to another embodiment of the invention, there is provided a diagnostic or calibration method for an object positioning including an actuator system with an actuator made of a material with predominantly electrostrictive properties and substantially no net polarization in absence of an electric field, said method comprising:
a) applying a bias electric field to the actuator;
b) measuring an electrical property of the actuator while applying the bias electric field; and
c) determining a mechanical state of the actuator from the measured electrical property and wherein step a) comprises a first sub-step a1) in which a non-zero actuation electric field superimposed on the bias electric field is applied to the actuator followed by a second sub-step a2) in which only the bias electric field is applied to the actuator, and wherein step b) is carried out during at least the second sub-step a2).

According to a further embodiment of the invention, there is provided a positioning control method for an object positioning system including an actuator system with an actuator made of a material with predominantly electrostrictive properties and substantially no net polarization in absence of an electric field, said method comprising:
a) applying an electric field to the actuator, said electric field comprising a bias electric field and an actuation electric field superimposed on the bias electric field, wherein a field strength of said actuation electric field is equal to or smaller than a field strength of the bias electric field;
b) measuring an electrical property of the actuator;
c) determining a mechanical state of the actuator from the measured electrical property;
d) determining a difference between the determined mechanical state of the actuator and a desired mechanical state of the actuator; and
e) adjusting the actuation electric field applied to the actuator based on the determined difference.

According to yet another embodiment of the invention, there is provided an object with a deformable surface, comprising an object positioning system according to the invention, wherein at least one actuator is arranged to adjust the deformable surface of the object.

According to another embodiment of the invention, there is provided a lithographic apparatus comprising an object positioning system according to the invention.

According to a further embodiment of the invention, there is provided a device manufacturing method wherein use is made of a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
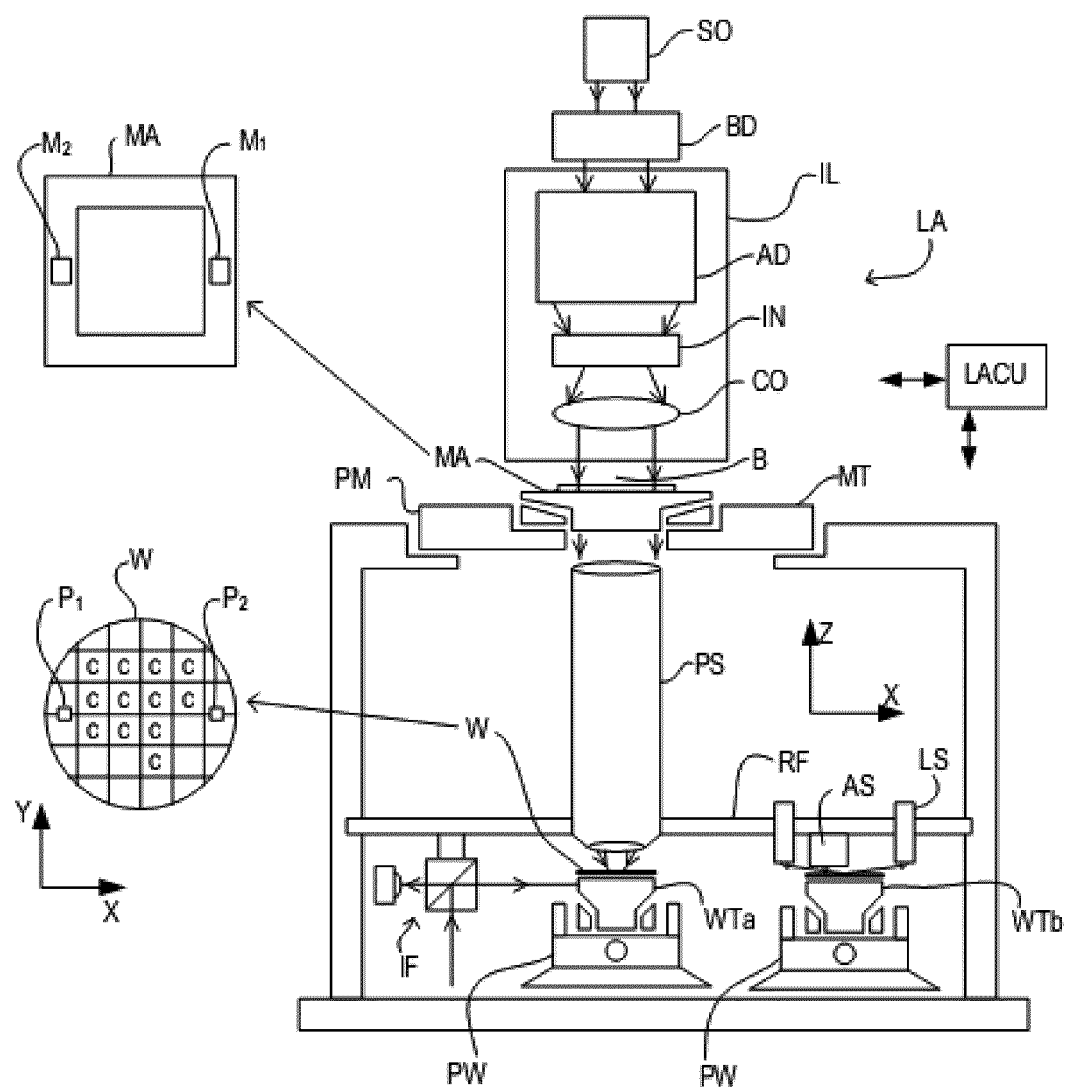
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

The lithographic apparatus may comprise objects that need to be positioned accurately in order to achieve the required or desired system performances. These objects can be found anywhere in the lithographic apparatus and may be part of the support MT constructed to support the patterning device MA, the substrate table WTa or WTb constructed to hold a substrate W, the projection system PS or the illumination system IL.

Figure 2:
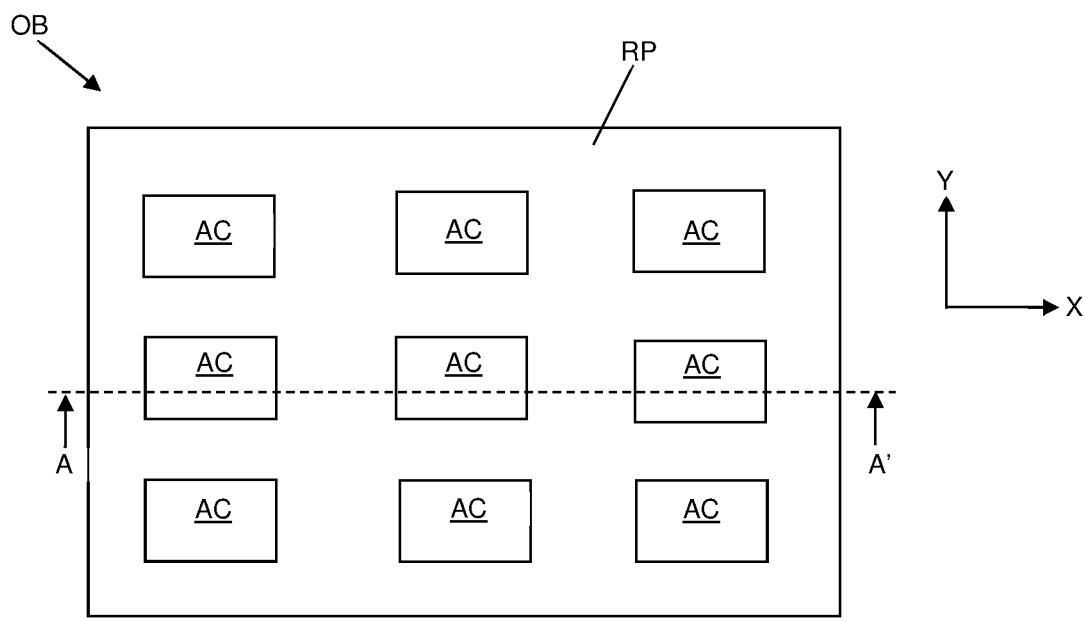
FIG. 2 schematically depicts a cross-section of an object within the lithographic apparatus of FIG. 1 that is positioned using an object positioning system according to an embodiment of the invention.
Figure 3:
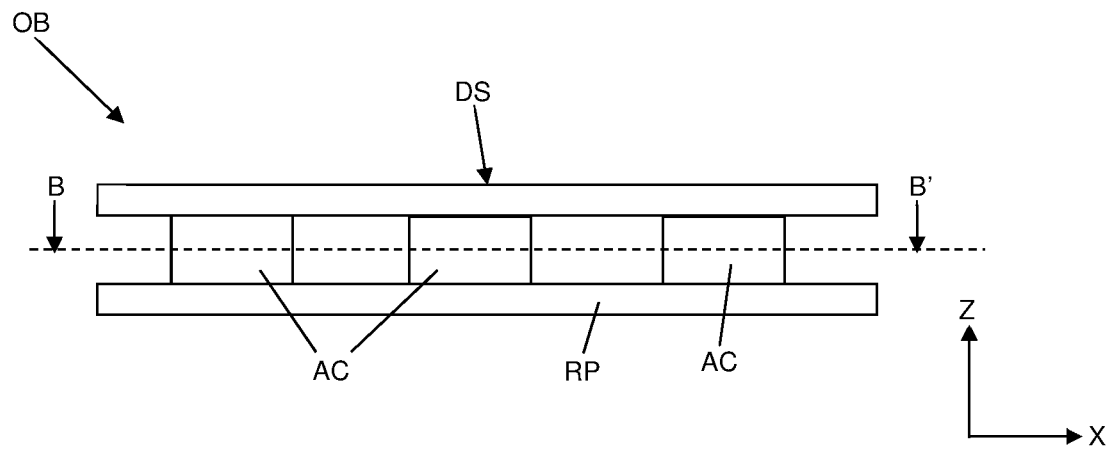
FIG. 3 schematically depicts another cross-section of the object of FIG. 2.

As an example, FIGS. 2 and 3 depict an object OB having a deformable surface DS. This object may be a mirror in the projection system, wherein the deformable surface DS forms a deformable mirror surface, or may alternatively be an active substrate table, wherein the deformable surface DS forms a deformable support surface for the substrate W.

FIGS. 2 and 3 both schematically depict two orthogonal cross-sections of the object OB. The cross-section of FIG. 2 extends in the X-Y plane while the cross-section of FIG. 3 extends in the X-Z plane. The cross-section of FIG. 3 is depicted in FIG. 2 using the line A-A' and the cross-section of FIG. 2 is depicted in FIG. 3 using the line B-B'.

The deformable surface DS in the embodiment of FIGS. 2 and 3 is deformable relative to a reference plate RP, which reference plate RP preferably has a significantly larger stiffness than the deformable surface DS, e.g. due to having a larger thickness.

The object OB comprises an object positioning system to deform the deformable surface DS. In this embodiment, the object positioning system comprises an actuator system with a plurality of actuators AC arranged in an array. Although here only nine actuators AC are shown in a 3×3 array, it will be apparent that any number of actuators and any dimension of the array may be used, but that nine actuators (in a 3×3 array) is a convenient number of actuators to clearly explain the invention.

It is noted here explicitly that the configuration using a reference plate RP is not necessary per se. It is also possible that the actuator system applies parallel surface actuation. Hence, the actuators can be mechanically connected to each other via the deformable surface only, via individual connections between neighboring actuators or via a common reference plate RP and any combinations thereof.

The actuators AC each comprise a material with predominantly electrostrictive properties and substantially no net polarization in absence of an electric field. As a result thereof the material has no or negligible piezoelectric properties, which is advantageous as this means that the material lacks piezoelectric hysteresis that could interfere with the electrostrictive behavior of the material.

The actuator system is configured to apply an electric field to each of the actuators, which electric field comprises a bias electric field and an actuation electric field superimposed on the bias electric field. The bias electric field will provide a bias deformation of the respective actuator allowing to measure the elongation and shortening of the actuator around said bias deformation state as an electrical property of the actuator will be affected by the elongation and shortening of the actuator.

When an actuator under the influence of a bias electric field is elongated or shortened due to a force applied to the actuator, or an additional electric field is applied to the actuator, the total charge across the actuator and thus the impedance of the actuator changes. The difference in charge or the change in impedance can thus be measured to determine the mechanical state of the actuator, e.g. the deformation.

The actuation electric field is used to actuate the actuator. Preferably, a field strength of the actuation electric field is equal to or smaller than a field strength of the bias electric field. This has the advantage that the electric field during actuation will not change direction, which results in more reliable measurements of the deformation of the actuator. More preferably, the maximum electric field strength of the actuation electric field is much smaller, e.g. at least 10 times or at least 100 times smaller, than the electric field strength of the bias electric field, which has the advantage that the actuation behavior of the actuator is substantially linear.

Figure 4:
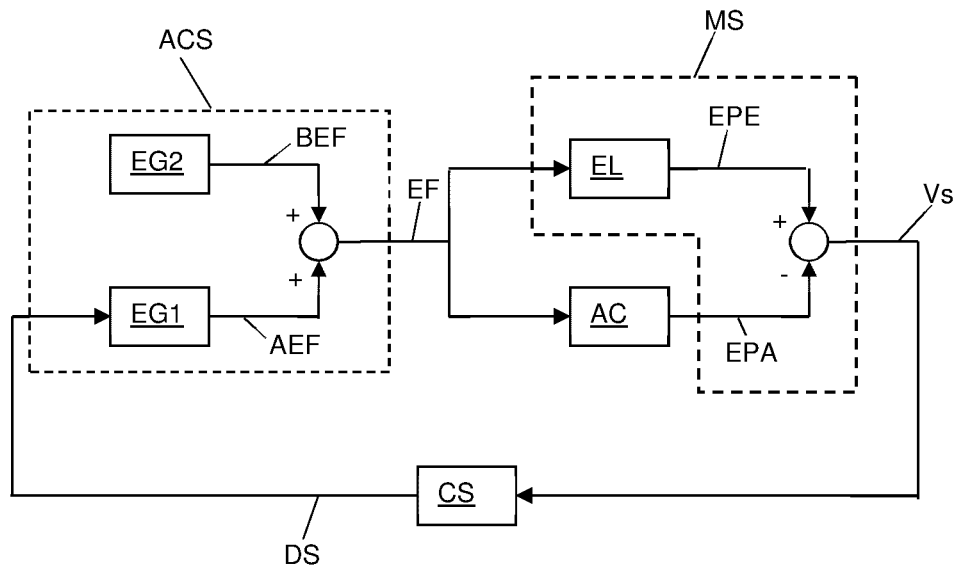
FIG. 4 schematically depicts a control scheme of the object and object positioning system of FIGS. 2 and 3.

FIG. 4 schematically depicts a control scheme of the object and corresponding object positioning system of FIGS. 2 and 3. The control scheme will be described in relationship to only one actuator AC, but it will be apparent to the skilled person that the same scheme is to be applied to all actuators AC.

FIG. 4 schematically depicts an actuator AC and an actuation system ACS. The actuation system comprises a first electric field generator EG1 to generate an actuation electric field AEF and a second electric field generator EG2 to generate a bias electric field BEF that are combined to form an electric field EF to be applied to the actuator AC.

The object positioning system further comprises a measurement system MS including a bridge circuit to include the actuator AC in one branch and a reference element EL in another parallel branch, which reference element EL has electrical properties matched to the electrical properties of the actuator, and which reference element EL is subjected to the same electric field EF as the actuator AC.

The measurement system is configured to measure an electrical property EPA of the actuator and the same electrical property EPE of the reference element. As the electrical properties of the actuator and the reference element are matched and subjected to the same electric field EF, the measured electrical property EPA of the actuator AC should in principle correspond to the measured electrical property EPE of the reference element EL. In other words, when the mechanical state of the actuator AC corresponds to the expected mechanical state as indicated by the reference element EL, a difference between the measured electrical property EPA of the actuator AC and the measured electrical property EPE of the reference element EL is zero indicating that there is no difference in behavior between the actuator and the reference element. However, when the mechanical state of the actuator is not as expected, e.g. due to loads applied to the object or due to cross-talk from other actuators, this difference in behavior will be expressed in a difference in measured electrical properties EPE and EPA and thus a non-zero signal Vs.

The bridge circuit may comprise a full-bridge arrangement using the reference element and the actuator and two additional electrical components, e.g. capacitors, but the bridge circuit may alternatively comprise a half-bridge arrangement using the reference element and the actuator such as in a charge-reconstruction scheme. In an embodiment, the reference element is similarly constructed as an actuator.

Besides cross-talk, the mechanical state of the actuator or adjacent actuators may be used to determine the interaction between the actuator and the actuator surroundings, e.g. to determine a relation between an actuator and the component, e.g. the deformable surface DS, it's actuating. Another example may include to determine the properties of a glue layer between the actuator and the deformable surface. Further, it allows to detect a change in properties, relations or interactions, e.g. when there is a change in resonance frequency due to a defect or crack in the deformable surface DS.

The measured electrical properties EPE and EPA may for instance be the electrical impedance across the reference element and the actuator, respectively, or a force induced charge of the reference element and actuator, respectively.

The signal Vs which is representative for the mechanical state of the actuator compared to a reference element EL may be used by a control system CS to control the first electric field generator EG1 in order to adjust the actuation electric field AEF. This allows for instance to accurately position the object OB and/or to dampen mechanical resonances of the actuator AC or object OB.

The signal Vs in FIG. 4 is used to control the actuation system. Alternatively, or additionally, the signal Vs, or any other signal representative for the mechanical state of the actuator AC, may be used in a diagnostic or calibration method as will be explained for an embodiment with reference to FIG. 5.

Figure 5:
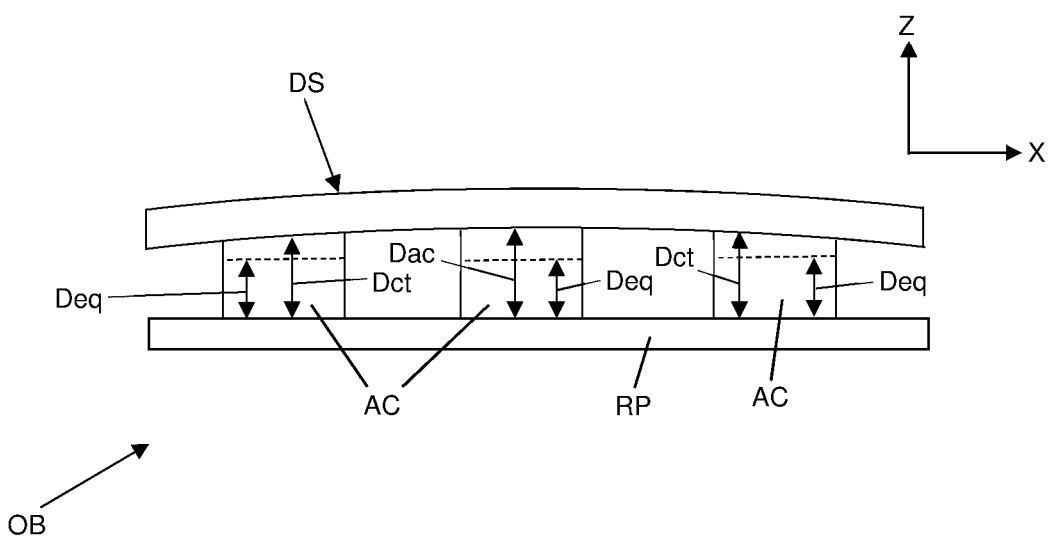
FIG. 5 schematically depicts a cross-section of the object of FIG. 3 in a diagnostics or calibration method.

FIG. 5 depicts the object OB of FIG. 3 with three actuators AC. In this embodiment, the left and right actuators AC are referred to as measured actuators or first actuators as only a bias electric field is applied to the actuators to measure an electrical property of these actuators, and the middle actuator AC is referred to as the actuated actuator or the second actuator as a non-zero electric field superimposed on the bias electric field is applied to this actuator.

In FIG. 5, the arrows Deq indicate the height of the actuators corresponding to the mechanical state of the actuators AC being subjected to only the bias electric field. Applying the non-zero actuation electric field superimposed to the bias electric field to the second actuator, the height of the actuator changes to the height indicated by arrow Dac thereby deforming the deformable surface DS.

As can be clearly seen in FIG. 5, applying the non-zero actuation electric field to the second actuator causes the neighboring first actuators AC to deform as well as indicated by the arrows Dct. This cross-talk between actuators can be measured by measuring a change in the signal Vs, i.e. a change in the electrical property when the non-zero actuation electric field is applied to the second actuator.

Although the embodiment of FIG. 5 only refers to one actuated actuator and two neighboring measured actuators, the same principle can be applied with any combination of actuated actuators and measured actuators in order to diagnose or calibrate the object positioning system.

In an embodiment, the same actuator is used as actuated actuator followed by being used as measured actuator. Hence, during a first sub-step, a non-zero actuation electric field superimposed on the bias electric field is applied to the actuator followed by a second sub-step in which only the bias electric field is applied to the actuator for measurement purposes. Hence, during the first sub-step, one or more resonance frequencies of the object may be excited, which one or more resonance frequencies are measured during the second sub-step. A change in measured resonance frequencies may then indicate that the properties of the object, e.g. the deformable surface have changed, e.g. due to a crack or other damage.

In an embodiment, the same change in resonance frequency or other property of the object may be measured using a plurality of actuators, in which a first actuator is used as actuated actuator and one or more second actuators are used as measured actuators. Hence, the same measurement principles can be used to determine a property of the object or the interface between the object and the actuator, e.g. to determine properties of a glue layer between the actuator and the deformable surface.

Figure 6:
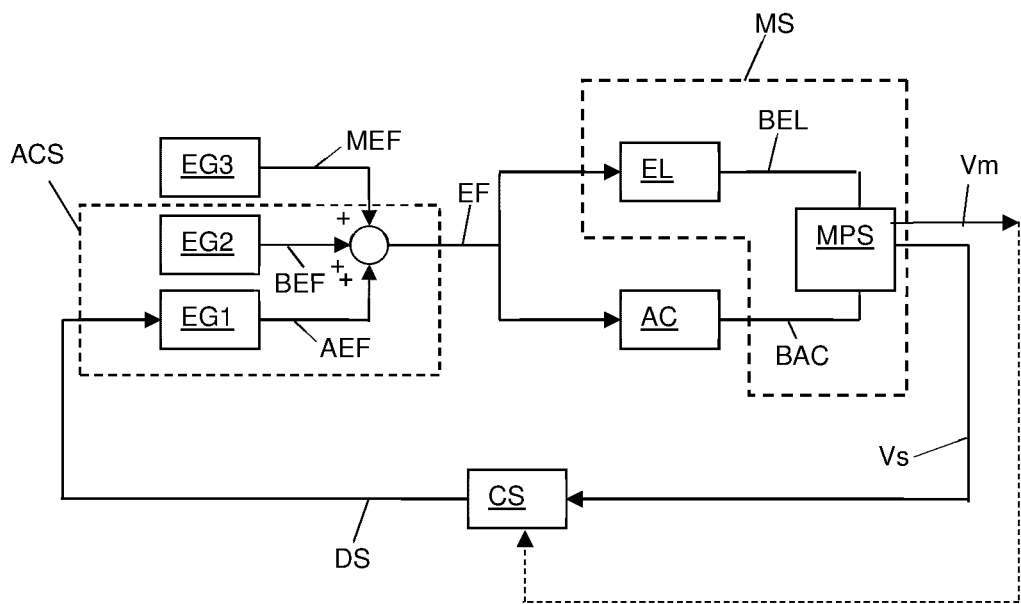
FIG. 6 schematically depicts an alternative control scheme of the object and object positioning system of FIGS. 2 and 3.

FIG. 6 schematically depicts an alternative control scheme of the object and object positioning system of FIGS. 2 and 3. Again, the control scheme will be described in relationship to only one actuator, but it will be apparent to the skilled person that the same scheme is to be applied to more, preferably all, actuators AC.

FIG. 6 schematically depicts an actuator AC and an actuation system ACS. The actuation system comprises a first electric field generator EG1 to generate an actuation electric field AEF and a second electric field generator EG2 to generate a bias electric field BEF that is combined with the actuation electric field AEF.

One of the differences between the control scheme depicted in FIG. 4 and the control scheme depicted in FIG. 6 is that the control scheme depicted in FIG. 6 comprises a third electric field generator EG3 to generate a measurement electric field MEF that is combined with the bias electric field BEF and the actuation electric field AEF to form an electric field EF to be applied to the actuator.

The third electric field generator EG3 is depicted separately from the actuation system ACS and a measurement system MS to be described in more detail below. However, it is very well possible that the third electric field generator in practice is part of the actuation system ACS or the measurement system MS.

The object positioning system further comprises a measurement system MS including a bridge circuit to include the actuator AC in one branch and a reference element EL in another parallel branch, which reference element EL has electrical properties matched to the electrical properties of the actuator, and which reference element EL is subjected to the same electric field EF as the actuator AC.

A response BEL of the reference element EL to the electric field EF and a response BAC of the actuator AC to the electric field are measured and processed by a measurement processing system MPS as will be explained in more detail below by reference to FIG. 7. For now, the behavior BEL of the reference element EL and the behavior BAC of the actuator AC are considered input to the measurement processing system MPS.

The measurement processing system MPS is configured to separate the behavior based on the bias electric field BEF and the actuation electric field from the behavior based on the measurement electric field to output a signal Vs representative for a difference in mechanical state of the reference element EL and the actuator AC, and to output a signal Vm representative for an electrical property of the actuator based on the measurement electric field.

Both signals Vs and Vm can be used by a control system CS to control the first electric field generator EG1 in order to adjust the actuation electric field AEF as will be explained below in more detail.

In this embodiment, the behavior based on the bias electric field BEF and the actuation electric field AEF can be separated from the behavior based on the measurement electric field MEF using frequency filtering. The bias electric field BEF is a constant electric field and the actuation system ACS may be configured to actuate the actuator in a predetermined actuation frequency range, e.g. from 0-1 kHz. By using a measurement electric field with a frequency range above this predetermined actuation frequency range, preferably well above this predetermined actuation frequency range, e.g. above the 100 kHz, band pass filters can be used to separate the behavior in the two mentioned frequency ranges.

Figure 7:
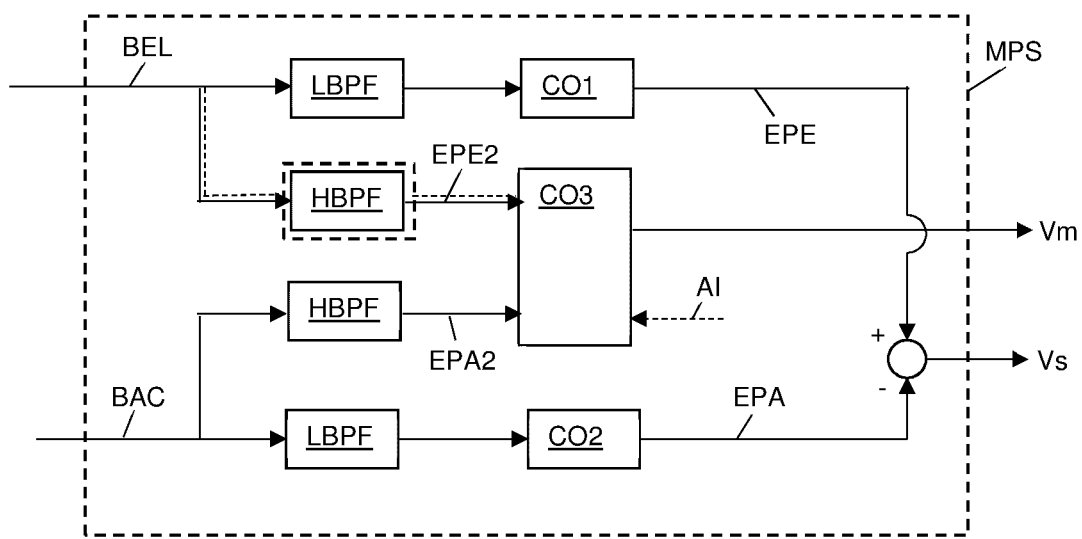
FIG. 7 schematically depicts a measurement processing system that can be used in the control scheme of FIG. 6.

FIG. 7 depicts a measurement processing system MPS that can be used in the scheme of FIG. 6 and which comprises a low-band-pass filter LBPF and a high-band-pass filter HBPF to be applied to both the behavior BEL of the reference element EL and the behavior BAC of the actuator AC.

The behavior BEL and the behavior BAC may be in a form to directly obtain a measured electrical property EPE representative for a mechanical state of the reference element EL and a measured electrical property EPA representative for a mechanical state of the actuator AC. However, in case these properties cannot be directly obtained, a respective converter CO1, CO2 may be used to convert the behavior BEL and the behavior BAC after being low-pass filtered into the measured electrical properties EPE and EPA, respectively.

As the electrical properties of the actuator and the reference element are matched and subjected to the same bias and actuation electric fields, the measured electrical property EPA of the actuator AC should in principle correspond to the measured electrical property EPE of the reference element EL. In other words, when the mechanical state of the actuator AC corresponds to the expected mechanical state as indicated by the reference element EL, a difference between the measured electrical property EPA of the actuator AC and the measured electrical property EPE of the reference element EL is zero indicating that there is no difference in behavior between the actuator and the reference element. However, when the mechanical state of the actuator is not as expected, e.g. due to loads applied to the object or due to cross-talk from other actuators, this difference in behavior will be expressed in a difference in measured electrical properties EPE and EPA and thus a non-zero signal Vs.

The bridge circuit may comprise a full-bridge arrangement using the reference element and the actuator and two additional electrical components, e.g. capacitors, but the bridge circuit may alternatively comprise a half-bridge arrangement using the reference element and the actuator such as in a charge-reconstruction scheme. In an embodiment, the reference element is similarly constructed as an actuator.

Besides cross-talk, the mechanical state of the actuator or adjacent actuators may be used to determine the interaction between the actuator and the actuator surroundings, e.g. to determine a relation between an actuator and the component, e.g. the deformable surface DS, it's actuating. Another example may include to determine the properties of a glue layer between the actuator and the deformable surface. Further, it allows to detect a change in properties, relations or interactions, e.g. when there is a change in resonance frequency due to a defect or crack in the deformable surface DS.

The measured electrical properties EPE and EPA may for instance be the electrical impedance across the reference element and the actuator, respectively, or a force induced charge of the reference element and actuator, respectively.

The behavior of the reference element and the actuator based on the measurement electric field is blocked by the low-band-pass filters LBPF and isolated by the high-band-pass filters HBPF. Because the frequency range of the measurement electric field is preferably well above the predetermined actuation frequency range, and preferably has a field strength smaller than a field strength of the combination of bias electric field and actuation electric field, e.g. less than a factor 10, preferably less than a factor 100, the measurement electric field may have no or limited influence on the mechanical behavior of the reference element EL and the actuator AC, so that this measurement electric field does not interfere with the actuation electric field and the required positioning accuracy, but allows to provide additional information such as temperature of the actuator AC.

When only an electrical property EPA2 of the actuator AC based on the measurement electric field is used in the measurement processing system MPS, a third converter CO3 may be used to convert this electrical property EPA2 into a signal Vm representative for a temperature of the actuator AC. When also an electrical property EPE2 of the reference element EL based on the measurement electric field is used, the third converter CO3 may be configured to convert the electrical property EPA2 and EPE2 into a signal Vm representative for a temperature difference between the actuator AC and the reference element EL. When the temperature of the reference element is known, e.g. using a separate temperature sensor, this can also be used to determine the temperature of the actuator AC.

In an embodiment, the measurement electric field may be applied at a single non-adjustable frequency, wherein the electrical property EPA2 is evaluated at this single frequency and the value is representative for the temperature.

In an embodiment, the measurement electric field may be applied at a single adjustable frequency, wherein the frequency is adjusted to track a feature such as a resonance or anti-resonance value of the electrical property EPA2, wherein the frequency itself is representative for the temperature.

In an embodiment, the measurement electric field may be a range of frequencies, such as noise, a sweep, a multi-sine, etc. that spans a range in which a feature shifts such as a resonance or anti-resonance value of the electrical property EPA2, and wherein a determined frequency of the feature is representative for the temperature.

When determining the temperature from the measured electrical property EPA2, additional information AI may be used to improve the temperature determination. For instance, when the electrical property EPA2 is also dependent on the electric field strength of the bias electric field and the actuation electric field, information on these electric field strength may be used to correct the temperature determination and remove said unwanted dependencies.

It is also envisaged that the electrical property EPA2 based on the measurement electric field is used to improve the measurement of the mechanical state of the actuator AC. This can for instance be done by measuring or knowing the temperature of the actuator in another way and comparing the temperature with the temperature as measured using the electrical property EPA2 as described above. Any difference between the two can then be used to improve the measurement of the mechanical state of the actuator or to determine another property of the actuator.

The signals Vs and Vm in FIG. 6 are used to control the actuation system. Alternatively, or additionally, the signals Vs and Vm, or any other signal representative for the mechanical state of the actuator AC, may be used in a diagnostic or calibration method as for instance explained for the embodiment with reference to FIG. 5.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

Other aspects of the invention are set out in the following numbered clauses:

1. An object positioning system including:
an actuator system; and
a measurement system,
wherein the actuator system comprises an actuator made of a material with predominantly electrostrictive properties and substantially no net polarization in absence of an electric field,
wherein the actuator system is configured to apply an electric field to the actuator, which electric field comprises a bias electric field and an actuation electric field superimposed on the bias electric field, a field strength of said actuation electric field being equal to or smaller than a field strength of the bias electric field,
wherein the measurement system is configured to measure an electrical property of the actuator which is representative for a mechanical state of the actuator.

2. An object positioning system according to clause 1, wherein the actuator system comprises a plurality of actuators, wherein the actuator system is configured to apply an electric field to each of the plurality of actuators, and wherein the measurement system is configured to measure an electrical property of each of the plurality of actuators.

3. An object positioning system according to clause 1 or 2, wherein the electrical property is an electrical impedance or a force induced charge of the actuator.

4. An object positioning system according to any of the clauses 1-3, wherein the measurement system comprises a bridge circuit including an actuator and a reference element having electrical properties matched to the electrical properties of the actuator, wherein the actuation system is configured to apply the same electric field to the actuator and the reference element, and wherein the bridge circuit is configured to output a signal representative for a difference in behavior of the actuator and the reference element.

5. An object positioning system according to clause 4, further comprising a control system configured to control the actuation system based on output signal of the bridge circuit of the measurement system in order to dampen mechanical resonances of the actuator.

6. An object positioning system according to any of the clauses 1-5, wherein the electric field to be applied to the actuator further comprises a measurement electric field superimposed on the bias electric field and the actuation electric field, said measurement electric field having a field strength smaller than a field strength of the combination of bias electric field and actuation electric field, and wherein the measurement system is configured to measure an electrical property of the actuator based on the measurement electric field.

7. An object positioning system according to clause 6, wherein the electrical property of the actuator based on the measurement electric field is representative for a temperature of the actuator.

8. An object positioning system according to clause 6 or 7, wherein the actuator system is configured to apply the actuation electric field to the actuator to actuate the actuator in a predetermined actuation frequency range, and wherein the measurement electric field has a frequency range outside the predetermined actuation frequency range.

9. An object positioning system according to clause 8, wherein the frequency range of the measurement electric field is above the predetermined actuation frequency range.

10. An object positioning system according to any of clauses 6-9, wherein the electrical property based on the measurement electric field is an electrical impedance value or charge value of the actuator.

11. An object positioning system according to any of clauses 6-9, wherein the electrical property based on the measurement electric field is a resonance or anti-resonance value of an electrical impedance or charge of the actuator.

12. An object positioning system according to any of clauses 6-11, wherein the measurement system is configured to determine the combination of bias electrical field and the actuation electric field applied to the actuator, and to compensate the measured electrical property based on the measurement electric field based on the determined combination of bias electrical field and the actuation electric field applied to the actuator.

13. A diagnostic or calibration method for an object positioning system including an actuator system with an actuator made of a material with predominantly electrostrictive properties and substantially no net polarization in absence of an electric field, said method comprising:

a) applying a bias electric field to the actuator;

b) measuring an electrical property of the actuator while applying the bias electric field; and c) determining a mechanical state of the actuator from the measured electrical property.

14. A diagnostic or calibration method according to clause 13, wherein step a) comprises a first sub-step a1) in which a non-zero actuation electric field superimposed on the bias electric field is applied to the actuator followed by a second sub-step a2) in which only the bias electric field is applied to the actuator, and wherein step b) is carried out during at least the second sub-step a2).

15. A diagnostic or calibration method according to clause 13 or 14, wherein the actuator system comprises a plurality of actuators, wherein steps a) to c) are carried out with respect to a first actuator, and wherein during step b) a non-zero actuation electric field superimposed on the bias electric field is applied to a second actuator.

16. A diagnostic or calibration method according to any of clauses 13-15, wherein the measured electrical property is an electrical impedance or a force induced charge of the respective actuator.

17. A diagnostic or calibration method according to any of clauses 13-16, further comprising:

e) superimposing a measurement electric field having a non-zero frequency and a field strength that is equal or smaller than the bias electric field on top of the bias electric field; and f) measuring an electrical property of the actuator based on the measurement electric field while applying the measurement electric field and the bias electric field.

18. A diagnostic or calibration method according to clause 17, further comprising the step of determining a temperature of the actuator from the measured electrical property based on the measurement electric field.

19. A diagnostic or calibration method according to clause 17 or 18, wherein the actuator is configured to operate in a predetermined actuation frequency range, and wherein the measurement electric field has a frequency range above the predetermined actuation frequency range.

20. A positioning control method for an object positioning system including an actuator system with an actuator made of a material with predominantly electrostrictive properties and substantially no net polarization in absence of an electric field, said method comprising:

a) applying an electric field to the actuator, said electric field comprising a bias electric field and an actuation electric field superimposed on the bias electric field, wherein a field strength of said actuation electric field is equal to or smaller than a field strength of the bias electric field;

b) measuring an electrical property of the actuator;

c) determining a mechanical state of the actuator from the measured electrical property;

d) determining a difference between the determined mechanical state of the actuator and a desired mechanical state of the actuator; and e) adjusting the actuation electric field applied to the actuator based on the determined difference.

21. A positioning control method according to clause 20, wherein the electric field comprises a measurement electric field having a non-zero frequency and a field strength smaller than a field strength of the combination of bias electric field and actuation electric field, wherein an electrical property of the actuator based on the measurement electric field is measured, and wherein adjusting the actuation electric field is also based on the measured electrical property of the actuator based on the measurement electric field.

22. An object with a deformable surface, comprising an object positioning system according to any of the clauses 1-12, wherein at least one actuator is arranged to adjust the deformable surface of the object.

23. An object according to clause 22, wherein the object positioning system is an object positioning system according to clause 2, and wherein the plurality of actuators forms an array arranged to adjust the deformable shape of the object.

24. A lithographic apparatus including an object positioning system according to any of the clauses 1-12.

25. A lithographic apparatus according to clause 24, further comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the object positioning system is part of the support, the substrate table, the projection system or the illumination system to position an element thereof.

26. A device manufacturing method wherein use is made of a lithographic apparatus according to clause 24 or 25.

The invention claimed is:

1. An object positioning system including:

an actuator system; and a measurement system, wherein the actuator system comprises an actuator made of a material with predominantly electrostrictive properties and substantially no net polarization in absence of an electric field, wherein the actuator system is configured to apply an electric field to the actuator, the electric field comprising a bias electric field and an actuation electric field superimposed on the bias electric field, a field strength of the actuation electric field being equal to or smaller than a field strength of the bias electric field, wherein the measurement system is configured to measure an electrical property of the actuator that is representative of a mechanical state of the actuator, wherein the measurement system comprises a bridge circuit including an actuator and a reference element having electrical properties matched to the electrical properties of the actuator, wherein the actuator system is configured to apply a same electric field to the actuator and the reference element, and wherein the bridge circuit is configured to output a signal representative of a difference in behavior between the actuator and the reference element.

2. The object positioning system of claim 1, further comprising a control system configured to control the actuator system based on an output signal of the bridge circuit in order to dampen mechanical resonances of the actuator.

3. The object positioning system of claim 1, wherein the electric field to be applied to the actuator further comprises:

a measurement electric field superimposed on the bias electric field and the actuation electric field, wherein the measurement electric field has a field strength smaller than a field strength of the combination of the bias electric field and the actuation electric field, and wherein the measurement system is configured to measure an electrical property of the actuator based on the measurement electric field.

4. The object positioning system of claim 3, wherein the electrical property of the actuator based on the measurement electric field is representative of a temperature of the actuator.

5. The object positioning system of claim 3, wherein:

the actuator system is configured to apply the actuation electric field to the actuator to actuate the actuator in a predetermined actuation frequency range, and the measurement electric field has a frequency range outside the predetermined actuation frequency range.

6. The object positioning system of claim 5, wherein the frequency range of the measurement electric field is above the predetermined actuation frequency range.

7. The object positioning system of claim 3, wherein the electrical property based on the measurement electric field is an electrical impedance value or charge value of the actuator.

8. The object positioning system of claim 3, wherein the electrical property based on the measurement electric field is a resonance or anti-resonance value of an electrical impedance or charge of the actuator.

9. The object positioning system of claim 3, wherein the measurement system is configured to determine the combination of the bias electric field and the actuation electric field applied to the actuator and to adjust the measured electrical property based on the measurement electric field based on the determined combination of the bias electric field and the actuation electric field applied to the actuator.

10. A method comprising:

applying a bias electric field to an actuator of an actuator system, the actuator comprising material with predominantly electrostrictive properties and substantially no net polarization in absence of an electric field;

measuring an electrical property of the actuator while applying the bias electric field; and determining a mechanical state of the actuator from the measured electrical property, wherein the applying comprises:

applying a non-zero actuation electric field superimposed on the bias electric field to the actuator, and applying only the bias electric field to the actuator, and wherein the measuring is carried out during at least the applying only the bias electric field.

11. The method of claim 10, further comprising:

using a plurality of the actuator; and performing the applying, measuring, and determining with respect to a first one of the plurality of the actuator, wherein a non-zero actuation electric field superimposed on the bias electric field is applied to a second one of the plurality of the actuator during the measuring.

12. The method of claim 10 further comprising:

superimposing a measurement electric field having a non-zero frequency and a field strength that is equal or smaller than the bias electric field on top of the bias electric field; and measuring an electrical property of the actuator based on the measurement electric field while applying the measurement electric field and the bias electric field.

13. The method of claim 12, further comprising determining a temperature of the actuator from the measured electrical property based on the measurement electric field.

14. The method of claim 12, wherein:

the actuator operates in a predetermined actuation frequency range, and the measurement electric field has a frequency range above the predetermined actuation frequency range.

15. A method comprising:

applying an electric field to an actuator of an actuator system, the actuator comprising material with predominantly electrostrictive properties and substantially no net polarization in absence of an electric field, the electric field comprising a bias electric field and an actuation electric field superimposed on the bias electric field, wherein a field strength of the actuation electric field is equal to or smaller than a field strength of the bias electric field;

measuring an electrical property of the actuator;

determining a mechanical state of the actuator from the measured electrical property;

determining a difference between the determined mechanical state of the actuator and a desired mechanical state of the actuator; and adjusting the actuation electric field applied to the actuator based on the determined difference.

16. The method of claim 15, wherein:

the electric field comprises a measurement electric field having a non-zero frequency and a field strength smaller than a field strength of the combination of the bias electric field and the actuation electric field, an electrical property of the actuator based on the measurement electric field is measured, and adjusting the actuation electric field is also based on the measured electrical property of the actuator based on the measurement electric field.

17. A system comprising:

an actuator system; and a measurement system, wherein the actuator system comprises an actuator made of a material with predominantly electrostrictive properties and substantially no net polarization in absence of an electric field, wherein the actuator system is configured to apply an electric field to the actuator, the electric field comprising a bias electric field and an actuation electric field superimposed on the bias electric field, a field strength of the actuation electric field being equal to or smaller than a field strength of the bias electric field, wherein the measurement system is configured to measure an electrical property of the actuator that is representative of a mechanical state of the actuator, wherein the measurement system comprises a bridge circuit including an actuator and a reference element having electrical properties matched to the electrical properties of the actuator, wherein the actuator system is configured to apply a same electric field to the actuator and the reference element, wherein the bridge circuit is configured to output a signal representative of a difference in behavior of the actuator and the reference element, and wherein at least one actuator is configured to adjust a deformable surface of an object.

18. The system of claim 17, wherein:

the actuator system comprises a plurality of the actuator, the actuator system is configured to apply an electric field to each of the plurality of the actuator, the measurement system is configured to measure an electrical property of each of the plurality of the actuator, and the plurality of the actuator forms an array configured to adjust the deformable shape of the object.

19. A lithographic apparatus comprising:
an object positioning system comprising:
   an actuator system; and
   a measurement system,
      wherein the actuator system comprises an actuator made of a material with predominantly electrostrictive properties and substantially no net polarization in absence of an electric field,
      wherein the actuator system is configured to apply an electric field to the actuator, the electric field comprising a bias electric field and an actuation electric field superimposed on the bias electric field, a field strength of the actuation electric field being equal to or smaller than a field strength of the bias electric field,
      wherein the measurement system is configured to measure an electrical property of the actuator that is representative of a mechanical state of the actuator,
      wherein the measurement system comprises a bridge circuit including an actuator and a reference element having electrical properties matched to the electrical properties of the actuator,
      wherein the actuator system is configured to apply a same electric field to the actuator and the reference element, and
      wherein the bridge circuit is configured to output a signal representative of a difference in behavior of the actuator and the reference element
   wherein the object positioning system is part of a support, a substrate table, a projection system or an illumination system of the lithographic apparatus to position an element thereof.

20. A device manufacturing method wherein use is made of a lithographic apparatus comprising:
an object positioning system including:
   an actuator system; and
   a measurement system,
      wherein the actuator system comprises an actuator made of a material with predominantly electrostrictive properties and substantially no net polarization in absence of an electric field,
      wherein the actuator system is configured to apply an electric field to the actuator, the electric field comprising a bias electric field and an actuation electric field superimposed on the bias electric field, a field strength of the actuation electric field being equal to or smaller than a field strength of the bias electric field,
      wherein the measurement system is configured to measure an electrical property of the actuator that is representative of a mechanical state of the actuator,
      wherein the measurement system comprises a bridge circuit including an actuator and a reference element having electrical properties matched to the electrical properties of the actuator,
      wherein the actuator system is configured to apply a same electric field to the actuator and the reference element,
      wherein the bridge circuit is configured to output a signal representative of a difference in behavior of the actuator and the reference element, and
   wherein the object positioning system is part of a support, a substrate table, a projection system or an illumination system of the lithographic apparatus to position an element thereof.

* * * * *

UNITED STATES PATENT AND TRADEMARK OFFICE
CERTIFICATE OF CORRECTION

PATENT NO. : 11,789,373 B2
APPLICATION NO. : 17/602616
DATED : October 17, 2023
INVENTOR(S) : Jansen et al.

Page 1 of 1

It is certified that error appears in the above-identified patent and that said Letters Patent is hereby corrected as shown below:

In the Claims

In Column 17, Claim 11, Lines 57-59, delete "a non-zero actuation electric field superimposed on the bias electric field is applied to a second one of the plurality of the actuator during the measuring." and insert the same at Line 56 after "wherein" as a continuation point.

In Column 17, Claim 12, Line 60, delete "10" and insert --10,--.

In Column 19, Claim 19, Line 31, after "element," delete "and".

In Column 19, Claim 19, Line 34, delete "element" and insert --element, and--.

Signed and Sealed this
Ninth Day of July, 2024

Katherine Kelly Vidal
*Director of the United States Patent and Trademark Office*